(12) United States Patent
Miwa et al.

(10) Patent No.: US 10,250,220 B2
(45) Date of Patent: Apr. 2, 2019

(54) ELASTIC WAVE DEVICE, ELECTRONIC COMPONENT, AND METHOD FOR MANUFACTURING ELASTIC WAVE DEVICE

(71) Applicant: Murata Manufacturing Co., Ltd., Nagaokakyo-shi, Kyoto-fu (JP)

(72) Inventors: Yuji Miwa, Nagaokakyo (JP); Hijiri Sumii, Nagaokakyo (JP); Junpei Yasuda, Nagaokakyo (JP); Taku Kikuchi, Nagaokakyo (JP); Hisashi Yamazaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 593 days.

(21) Appl. No.: 15/014,239

(22) Filed: Feb. 3, 2016

(65) Prior Publication Data

US 2016/0156331 A1   Jun. 2, 2016

Related U.S. Application Data

(63) Continuation of application No. PCT/JP2014/071172, filed on Aug. 11, 2014.

(30) Foreign Application Priority Data

Aug. 14, 2013   (JP) ................................ 2013-168676

(51) Int. Cl.
*H03H 9/25*   (2006.01)
*H03H 9/02*   (2006.01)
(Continued)

(52) U.S. Cl.
CPC .......... *H03H 9/02992* (2013.01); *H03H 3/08* (2013.01); *H03H 9/059* (2013.01);
(Continued)

(58) Field of Classification Search
CPC ............. H03H 9/02992; H03H 9/0959; H03H 9/1064; H03H 9/0542; H03H 9/02574; H03H 3/08; H01L 2224/16225
See application file for complete search history.

(56) References Cited

U.S. PATENT DOCUMENTS 6,344,234 B1   2/2002   Dalal et al.
6,372,622 B1   4/2002   Tan et al.
(Continued)

FOREIGN PATENT DOCUMENTS

JP   2001-168515 A   6/2001
JP   2004-146728 A   5/2004
(Continued)

OTHER PUBLICATIONS

Official Communication issued in corresponding Japanese Patent Application No. 2015-531807, dated May 8, 2018.
(Continued)

*Primary Examiner* — J. San Martin
(74) *Attorney, Agent, or Firm* — Keating & Bennett, LLP

(57) ABSTRACT

An elastic wave device includes a piezoelectric substrate, an IDT electrode, wiring, a pad, an under bump metal, a first dielectric layer, and a second dielectric layer. At least a portion of the IDT electrode includes a first electrically conductive film, at least a portion of the wiring includes a multilayer body including the first electrically conductive film and a second electrically conductive film, and at least a portion of the pad includes the second electrically conductive film. The second dielectric layer covers the region other than the contact region between the second electrically conductive film and the under bump metal. Consequently, the second electrically conductive film is covered with the second dielectric layer and the under bump metal and is not exposed to air.

15 Claims, 11 Drawing Sheets

(51) Int. Cl.
*H03H 3/08* (2006.01)
*H03H 9/05* (2006.01)
*H03H 9/10* (2006.01)

(52) U.S. Cl.
CPC . *H03H 9/1064* (2013.01); *H01L 2224/16225* (2013.01); *H03H 9/02574* (2013.01); *H03H 9/0542* (2013.01)

(56) References Cited

U.S. PATENT DOCUMENTS

| | | | |
|---|---|---|---|
| 6,516,503 B1* | 2/2003 | Ikada | H03H 3/08 |
| | | | 216/79 |
| 10,075,148 B2* | 9/2018 | Iwamoto | H03H 9/542 |
| 2005/0071971 A1 | 4/2005 | Yamato | |
| 2006/0131991 A1 | 6/2006 | Kawakami | |
| 2007/0278898 A1 | 12/2007 | Miura et al. | |
| 2008/0266023 A1 | 10/2008 | Tanaka | |
| 2010/0127597 A1 | 5/2010 | Kamiguchi et al. | |
| 2015/0262840 A1* | 9/2015 | Hsu | H01L 21/485 |
| | | | 216/18 |
| 2016/0156331 A1* | 6/2016 | Miwa | H03H 3/08 |
| | | | 310/313 B |
| 2016/0285430 A1* | 9/2016 | Kikuchi | H03H 3/08 |
| 2017/0317659 A1* | 11/2017 | Takeshita | H03H 3/08 |
| 2018/0131345 A1* | 5/2018 | Fukuda | H03H 9/1071 |
| 2018/0159505 A1* | 6/2018 | Jung | H03H 9/1071 |
| 2018/0248535 A1* | 8/2018 | Koreeda | H03H 9/25 |

FOREIGN PATENT DOCUMENTS

| | | | | |
|---|---|---|---|---|
| JP | 2005-117151 A | | 4/2005 | |
| JP | 2007081613 A | * | 3/2007 | H03H 3/08 |
| JP | 2007-180293 A | | 7/2007 | |
| JP | 2007-329584 A | | 12/2007 | |
| JP | 2009010559 A | * | 1/2009 | H01L 41/053 |
| JP | 2010-130031 A | | 6/2010 | |
| JP | 2010-267641 A | | 11/2010 | |
| JP | 2011-244065 A | | 12/2011 | |
| JP | 2012-65092 A | | 3/2012 | |
| WO | 2005/002049 A1 | | 1/2005 | |

OTHER PUBLICATIONS

Official Communication issued in International Application PCT/JP2014/071172, dated Nov. 4, 2014.

* cited by examiner

ELASTIC WAVE DEVICE, ELECTRONIC COMPONENT, AND METHOD FOR MANUFACTURING ELASTIC WAVE DEVICE

BACKGROUND OF THE INVENTION

1. Field of the Invention

The present invention relates to an elastic wave device, an electronic component including an elastic wave device, and a method for manufacturing an elastic wave device.

2. Description of the Related Art

Elastic wave devices serving as duplexers or section filters are incorporated in RF (radio frequency) circuits in communication equipment, e.g., cellular phones.

For example, Japanese Unexamined Patent Application Publication No. 2011-244065 describes an elastic wave device 101, as illustrated in FIG. 8A and FIG. 8B. FIG. 8A is a diagram of the elastic wave device 101 in plan view, and FIG. 8B is a sectional view of the elastic wave device 101 taken along a line VIIIB-VIIIB in FIG. 8A. The elastic wave device 101 includes a piezoelectric substrate 110, an IDT (inter digital transducer) electrode 111, wiring 114, a pad 120, a first dielectric layer 115, and a second dielectric layer 116. The IDT electrode 111 includes first and second comb-shaped electrodes 112 and 113. The first and second comb-shaped electrodes 112 and 113 have a plurality of electrode fingers 112a and 113a, respectively, arranged along the elastic wave propagation direction (Y direction) and busbars 112b and 113b respectively connected to the plurality of electrode fingers 112a and 113a. The electrode fingers 112a and 113a are formed from a first electrically conductive film 141. The busbars 112b and 113b are formed from a multilayer body of the first electrically conductive film 141 and a second electrically conductive film 142.

The IDT electrode 111 of the elastic wave device 101 is disposed on the piezoelectric substrate 110. The first dielectric layer 115 is a layer to adjust a band width ratio of the elastic wave device 101 or to compensate the frequency temperature characteristics and is disposed on the piezoelectric substrate 110 so as to cover the electrode fingers 112a and 113a. The second dielectric layer 116 is a layer to adjust the resonant frequency of the elastic wave device 101 and is disposed so as to cover the first dielectric layer 115. Above the piezoelectric substrate 110, the region in which the second electrically conductive film 142 defining the busbars 112b and 113b and the region in which the second dielectric layer 116 is disposed do not overlap one another and are different regions.

FIG. 8B is a sectional view of a cross-section of part of the elastic wave device 101 taken along a line VIIIB-VIIIB illustrated in FIG. 8A. FIG. 9 is a sectional view of the entire elastic wave device 101 taken along a line IX-IX illustrated in FIG. 8A. The elastic wave device 101 illustrated in FIG. 9 further includes under bump metals 118. The under bump metals 118 are disposed on parts of pads 120. The wiring 114 and the pads 120 are formed from a multilayer body of the first electrically conductive film 141 and the second electrically conductive film 142.

A method for manufacturing the elastic wave device 101 illustrated in FIG. 9 will be described with reference to FIG. 10A to FIG. 10D. First, as illustrated in FIG. 10A, the first electrically conductive film 141, the first dielectric layer 115, and the second dielectric layer 116 are formed on the piezoelectric substrate 110. The electrode fingers 112a and 113a of the IDT electrode 111 are formed from the first electrically conductive film 141. Thereafter, as illustrated in FIG. 10B, parts of the first dielectric layer 115 and the second dielectric layer 116 are removed so that parts of the first electrically conductive film 141 are exposed, and openings 125 are formed above the piezoelectric substrate 110. Subsequently, as illustrated in FIG. 10C, the second electrically conductive films 142 are formed in the openings 125 above the piezoelectric substrate 110. At this time, the second electrically conductive film 142 is stacked on the first electrically conductive film 141. The busbars 112b and 113b, the wiring 114, and the pad 120 are formed from the multilayer body of the first electrically conductive film 141 and second electrically conductive film 142. Then, as illustrated in FIG. 10D, the under bump metal 118 is formed on the second electrically conductive film 142 defining the pad 120. In this regard, the surface of the second electrically conductive film 142 in the vicinity of a contact region C between the second electrically conductive film 142 and the under bump metal 118 is exposed to air.

FIG. 11 is a diagram illustrating an electronic component 102 including the elastic wave device 101 illustrated in FIG. 9. The electronic component 102 includes the elastic wave device 101 and further includes a mounting substrate 131, solder 139, and an insulating resin 132. The electronic component 102 is produced by bonding the elastic wave device 101 and the mounting substrate 131 by using the solder 139 and, thereafter, forming the insulating resin 132 so as to cover the mounting substrate 131 and the elastic wave device 101.

In order to bond the elastic wave device 101 by using the solder 139, a solder paste is used as a bonding agent. However, since the solder paste contains flux, the second electrically conductive film 142 may corrode in the case of contact between the flux and the second electrically conductive film 142. In particular, in the case where Al (aluminum) is used as the material for the second electrically conductive film 142, a chemical reaction may occur between Al and halogen compounds (chlorine ion or the like) in the flux and the second electrically conductive film 142 may corrode. Consequently, the reliability of bonding between the elastic wave device 101 and the mounting substrate 131 may decrease.

SUMMARY OF THE INVENTION

Preferred embodiments of the present invention provide an elastic wave device and a method for manufacturing an elastic wave device, in which corrosion due to flux contained in a solder paste is not caused easily at the time of bonding of the elastic wave device and a mounting substrate by using solder. Also, preferred embodiments of the present invention provide an electronic component including the elastic wave device.

An elastic wave device according to a preferred embodiment of the present invention includes a piezoelectric substrate, an IDT electrode disposed on the piezoelectric substrate, a pad disposed on the piezoelectric substrate, wiring which is disposed on the piezoelectric substrate and which connects the IDT electrode to the pad, a first dielectric layer disposed on the piezoelectric substrate so as to cover at least a portion of the IDT electrode and not to cover the wiring and the pad, an under bump metal disposed on the pad, and a second dielectric layer disposed above the piezoelectric substrate so as to cover a portion of the pad, the wiring, and the first dielectric layer and not to cover the under bump metal, in which at least a portion of the IDT electrode includes a first electrically conductive film, at least a portion of the wiring includes a multilayer body including the first electrically conductive film and a second electrically conductive film stacked on the first electrically conductive film, at least a portion of the pad includes the second electrically conductive film, and the second dielectric layer is disposed above the piezoelectric substrate so as to cover the region other than the contact region between the second electrically conductive film and the under bump metal.

Preferably, the second dielectric layer is disposed so as to continuously cover the surface of the second electrically conductive film and the surface of the first dielectric layer.

Also, it is preferable that the second dielectric layer be provided and planarized on the surface of the first dielectric layer located on the IDT electrode.

Also, it is preferable that the material for the second dielectric layer have an elastic wave propagation velocity higher than the elastic wave propagation velocity of the material for the first dielectric layer.

Also, it is preferable that the material for the second dielectric layer have a moisture permeability lower than the moisture permeability of the material for the first dielectric layer.

An electronic component according to another preferred embodiment of the present invention includes the above-described elastic wave device and further includes, besides the elastic wave device, a mounting substrate to mount the elastic wave device and solder disposed between the elastic wave device and the mounting substrate, in which the solder is not in contact with the second electrically conductive film of the elastic wave device and is in contact with the under bump metal.

A method for manufacturing an elastic wave device according to a further preferred embodiment of the present invention includes forming a first electrically conductive film on a piezoelectric substrate, forming a first dielectric layer on the piezoelectric substrate so as to cover the first electrically conductive film, forming a first opening in the first dielectric layer so as to expose a portion of the first electrically conductive film, forming a second electrically conductive film in the first opening, forming a second dielectric layer so as to cover the first dielectric layer and the second electrically conductive film, forming a second opening in the second dielectric layer so as to expose a portion of the second electrically conductive film, and forming an under bump metal in the second opening.

In elastic wave devices according to various preferred embodiments of the present invention, the second dielectric layer is disposed above the piezoelectric substrate so as to cover the region other than the contact region between the second electrically conductive film and the under bump metal. Consequently, the second electrically conductive film is covered with the under bump metal and the second dielectric layer and is not exposed to air. According to this, at the time of bonding of the elastic wave device to the mounting substrate by using the solder, flux contained in the solder does not come into contact with the second electrically conductive film. As a result, a chemical reaction between a halogenated element in the flux contained in the solder paste and the material contained in the second electrically conductive film does not occur and corrosion of the second electrically conductive film does not occur easily.

In electronic components according to various preferred embodiments of the present invention, the solder is not in contact with the second electrically conductive film of the elastic wave device and is in contact with the under bump metal. That is, the region other than the contact region between the second electrically conductive film and the under bump metal is covered with the second dielectric layer, and the solder does not adhere to the second electrically conductive film. The flux contained in the solder paste does not adhere to the second electrically conductive film at the time of mounting, so that the second electrically conductive film of the elastic wave device included in the electronic component does not corrode easily.

In methods for manufacturing an elastic wave device according to preferred embodiments of the present invention, the first dielectric layer, the first electrically conductive film, and the second electrically conductive film are formed on the piezoelectric substrate and, thereafter, the second dielectric layer is formed thereon, the second opening is formed in only the region to be provided with the under bump metal, and the under bump metal is formed therein. Consequently, after the elastic wave device is produced, the second electrically conductive film is not exposed to air. As a result, in the case where the elastic wave device is bonded to the mounting substrate by using the solder, the flux contained in the solder paste does not come into contact with the second electrically conductive film, and the second electrically conductive film does not corrode easily.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 6A is a diagram viewed in the same section as the cross-section along the line IIC-IIC illustrated in FIG. 1.

FIG. 6B is a diagram viewed in the same section as the cross-section along the line IIC-IIC illustrated in FIG. 1.

FIG. 6C is a diagram viewed in the same section as the cross-section along the line IIC-IIC illustrated in FIG. 1.

FIG. 6D is a diagram viewed in the same section as the cross-section along the line IIC-IIC illustrated in FIG. 1.

FIG. 7A is a diagram viewed in the same section as the cross-section along the line IIC-IIC illustrated in FIG. 1.

FIG. 7B is a diagram viewed in the same section as the cross-section along the line IIC-IIC illustrated in FIG. 1.

FIG. 7C is a diagram viewed in the same section as the cross-section along the line IIC-IIC illustrated in FIG. 1.

FIG. 7D is a diagram viewed in the same section as the cross-section along the line IIC-IIC illustrated in FIG. 1.

FIG. 7E is a diagram viewed in the same section as the cross-section along the line IIC-IIC illustrated in FIG. 1.

DETAILED DESCRIPTION OF THE PREFERRED EMBODIMENTS

Figure 1:
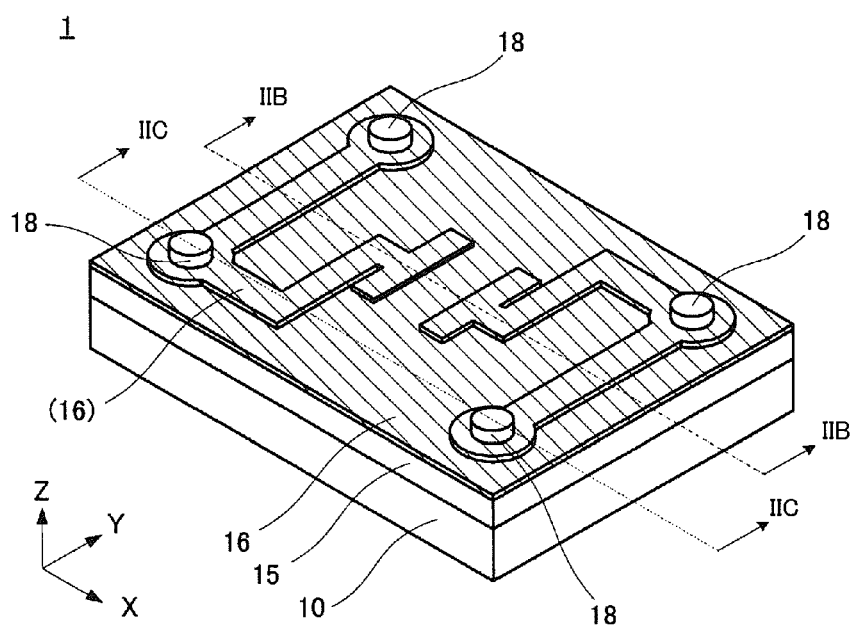
FIG. 1 is a perspective view of an elastic wave device 1 according to a preferred embodiment of the present invention.

As illustrated in FIG. 1 and FIG. 2A to FIG. 2C, an elastic wave device 1 according to a preferred embodiment of the present invention includes at least a piezoelectric substrate 10, an IDT (inter digital transducer) electrode 11, wiring 14, a pad 20, a first dielectric layer 15, a second dielectric layer 16, and an under bump metal 18.

The piezoelectric substrate 10 includes an appropriate piezoelectric. Examples of the materials for the piezoelectric substrate 10 include lithium niobate, potassium niobate, lithium tantalate, quartz, langasite, zinc oxide, PZT, and lithium tetraborate. In the explanation of the present preferred embodiment, a 127° rotated Y-cut X-propagation $LiNbO_3$ substrate is mentioned as an example of the piezoelectric substrate 10.

The IDT electrode 11 is disposed on the piezoelectric substrate 10. The IDT electrode 11 includes first and second comb-shaped electrodes 12 and 13. The first and second comb-shaped electrodes 12 and 13 include a plurality of electrode fingers 12a and 13a, respectively, arranged along the elastic wave propagation direction (Y direction) and busbars 12b and 13b, respectively, connected to the plurality of electrode fingers 12a and 13a. The first and second comb-shaped electrodes 12 and 13 are interdigitated. That is, the first and second comb-shaped electrodes 12 and 13 are disposed so that the electrode fingers 12a and 13a are arranged alternately in the elastic wave propagation direction. In this regard, a pair of reflectors (not shown in the drawing) may be disposed on both sides in the elastic wave propagation direction of the region provided with the IDT electrode 11.

Figure 2A:
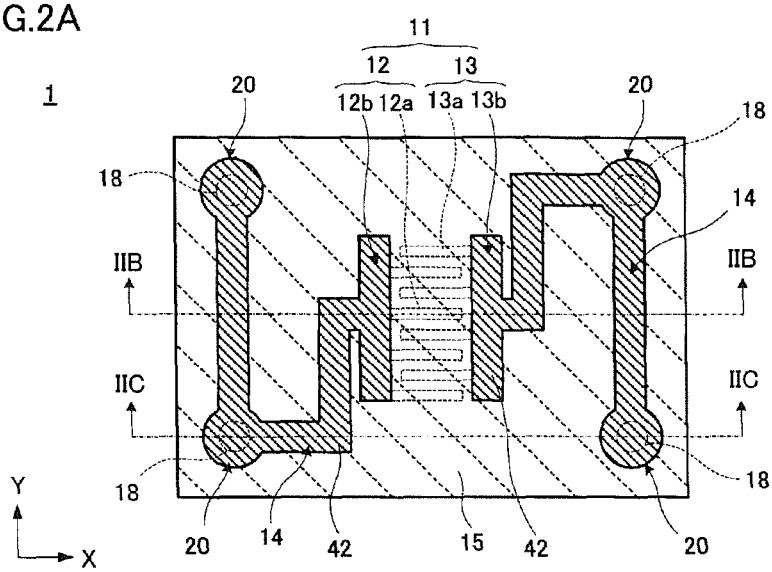
FIG. 2A is a sectional view (cut surface only) of the elastic wave device 1, along a line IIA-IIA illustrated in FIG. 2B.

Furthermore, the wiring 14 and the pad 20 are disposed above the piezoelectric substrate 10. The wiring 14 electrically connects the IDT electrode 11 to the pad 20. As illustrated in FIG. 2A, one end of the wiring 14 is connected to the busbar 12b or busbar 13b, and the other end of the wiring 14 is connected to the pad 20. The shapes and the arrangements of the IDT electrode 11, the wiring 14, and the pad 20 illustrated in FIG. 2A are merely examples. A plurality of IDT electrodes 11, wiring 14, and pads 20 may be disposed on the piezoelectric substrate 10, as necessary.

The electrode fingers 12a and 13a in the IDT electrode are preferably defined by the first electrically conductive film 41. The first electrically conductive film 41 is made of, for example, a metal, e.g., Au, Cu, Ag, W, Ta, Pt, Ni, Mo, Al, Ti, Cr, Pd, Co, or Mn, or an alloy containing at least one of the metals as a primary component. Alternatively, the first electrically conductive film 41 may be a multilayer body of a plurality of electrically conductive films made of the above-described metals and alloys. The first electrically conductive film 41 includes, for example, a multilayer film in which a NiCr layer (thickness: about 10 nm), a Pt layer (thickness: about 33 nm), a Ti layer (thickness: about 10 nm), an Al—Cu alloy layer (thickness: about 130 nm), and a Ti layer (thickness: about 10 nm) are stacked in this order. Consequently, a high reflection coefficient is realized. Note that the wavelength of the IDT electrode 11 in this case preferably is about 1.9 μm and the metallization ratio is about 0.5, for example.

In the IDT electrode 11, the busbars 12b and 13b, the wiring 14, and the pad 20 are preferably defined by a multilayer body of the first electrically conductive film 41 and the second electrically conductive film 42. The first electrically conductive film 41 is as described above. The second electrically conductive film 42 is made of, for example, a metal, e.g., Au, Cu, Ag, W, Ta, Pt, Ni, Mo, Al, Ti, Cr, Pd, Co, or Mn, or an alloy containing at least one of the metals as a primary component. Alternatively, the second electrically conductive film 42 may be a multilayer body of a plurality of electrically conductive films made of the above-described metals and alloys. The second electrically conductive film 42 includes, for example, a multilayer film in which an Al—Cu alloy layer (thickness: about 700 nm), a Ti layer (thickness: about 600 nm), and an Al layer (thickness: about 1,140 nm) are stacked in this order from the piezoelectric substrate 10 side.

The thicknesses of the busbars 12b and 13b, the wiring 14, and the pad 20 defined by the first electrically conductive film 41 and the second electrically conductive film 42 are larger than the thicknesses of the electrode fingers 12a and 13a defined by the first electrically conductive film 41. In the case where the thicknesses of the busbars 12b and 13b, the wiring 14, and the pad 20 are large, the electric resistance value is reduced, so that the insertion loss is reduced and the mechanical strength is enhanced.

At least a portion of the IDT electrode 11 preferably is defined by the first electrically conductive film 41. The entire IDT electrode 11 may be defined by the first electrically conductive film 41. Specifically, the busbars 12b and 13b may be defined by only the first electrically conductive film 41. At least a portion of the wiring 14 preferably is defined by the multilayer body including the first electrically conductive film 41 and the second electrically conductive film 42 stacked on the first electrically conductive film 41. In other words, the entire wiring 14 is not necessarily defined by the multilayer body of the first electrically conductive film 41 and the second electrically conductive film 42. At least a portion of the pad 20 preferably is defined by the second electrically conductive film 42. The entire pad 20 may be defined by the second electrically conductive film 42.

The under bump metal 18 is disposed on a portion of the pad 20. The under bump metal 18 is a terminal to lead outward the electrical characteristics of the elastic wave device 1 and is a location where the elastic wave device 1 is bonded to the mounting substrate 31 (refer to FIG. 5) by using the solder 39. At the time of bonding by using the solder 39, a solder bump for bonding (not shown in the drawing) may be formed on the under bump metal 18 in advance or a solder bump for bonding (not shown in the drawing) may be formed on the mounting substrate 31 in advance.

The under bump metal 18 contains a material, to which the solder 39 adheres easily, and contains a material which makes diffusion of the material contained in the solder 39 into the under bump metal 18 difficult. In order to facilitate adhesion of the solder 39, for example, a metal, e.g., Au, is preferably used. In order to suppress diffusion, for example, a metal, e.g., Ni or Cu, preferably is preferably used as a barrier layer.

In addition, the first dielectric layer 15 is disposed on the piezoelectric substrate 10. The first dielectric layer 15 is a layer to adjust the frequency band of the elastic wave device 1 and is a layer to improve the frequency temperature characteristics. The first dielectric layer 15 is disposed so as to cover the electrode fingers 12a and 13a of the IDT electrode 11 and not to cover the upper portions (Z direction side) of the busbars 12b and 13b, the wiring 14, and the pad 20 while being in contact with the side surfaces of the busbars 12b and 13b, the wiring 14, and the pad 20. Consequently, the electrode fingers 12a and 13a of the IDT electrode 11 are in the state of being embedded in the first dielectric layer 15. The elastic wave excited by the IDT electrode 11 propagates not only on the surface of the piezoelectric substrate 10 but also through the inside of the first dielectric layer 15.

Examples of the materials for the first dielectric layer 15 include $Si_3N_4$, SiON, SiC, $Ta_2O_5$, $TiO_2$, TiN, $Al_2O_3$, and $TeO_2$. In the present preferred embodiment, for example, a $SiO_2$ layer is preferably used as the first dielectric layer 15.

The thickness of the first dielectric layer 15 is larger than the thicknesses of the electrode fingers 12a and 13a of the IDT electrode 11 and is, for example, about 20% to about 50% of a ratio relative to the wavelength of the elastic wave basis. The reasons therefor are as follows. If the thickness of the first dielectric layer 15 is too large, the pass band of the elastic wave device 1 cannot be formed and desirable filter characteristics cannot be realized and if the thickness of the first dielectric layer 15 is too small, desirable frequency temperature characteristics cannot be obtained. In particular, in the case where a $LiNbO_3$ substrate is used as the piezoelectric substrate 10, the TCF (temperature characteristic compensation factor) is about −90 ppm/° C. to about −70 ppm/° C. and in order to compensate the temperature characteristics of the elastic wave device 1 in this range, the thickness of the first dielectric layer 15 needs to be increased sufficiently. In the present preferred embodiment, the thickness of the first dielectric layer 15 is, for example, about 620 nm.

Also, preferably, the surface 21 on the upper surface side (Z direction side) of the first dielectric layer 15 is planarized. If there is unevenness on the surface of the first dielectric layer 15, the elastic wave propagating through the inside of the first dielectric layer 15 is irregularly reflected at the uneven portions, and the reflection coefficient of the elastic wave is reduced. With the planarized surface 21 of the first dielectric layer 15, a large reflection coefficient is obtained. Consequently, the temperature characteristics are compensated without degrading the frequency characteristics of the elastic wave device 1 significantly.

The second dielectric layer 16 is disposed on the busbars 12b and 13b of the IDT electrode 11, on the wiring 14, on the pad 20, and on the first dielectric layer 15. Specifically, the second dielectric layer 16 extends along the surface of the second electrically conductive layer 42 and the surface 21 of the first dielectric layer 15 continuously in the region NC other than the contact region C between the second electrically conductive layer 42 defining the pad 20 and the under bump metal 18. Note that in the elastic wave device 1, the thickness of the second electrically conductive layer 42 is larger than the thickness of the first dielectric layer 15 and therefore the second dielectric layer 16 has a shape with a step from the second electrically conductive layer 42 toward the first dielectric layer 15.

Figure 2B:
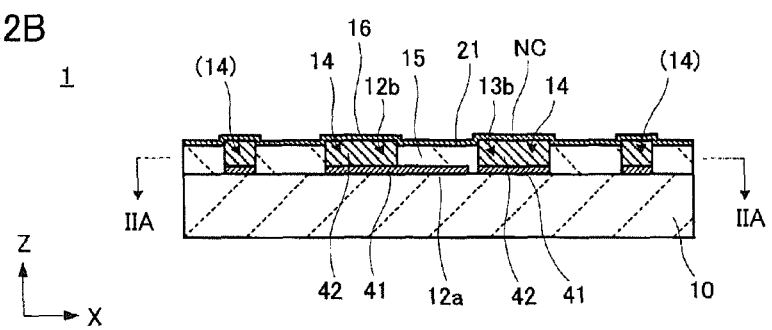
FIG. 2B is a sectional view (cut surface only) of the elastic wave device 1, along a line IIB-IIB illustrated in FIG. 1.
Figure 2C:
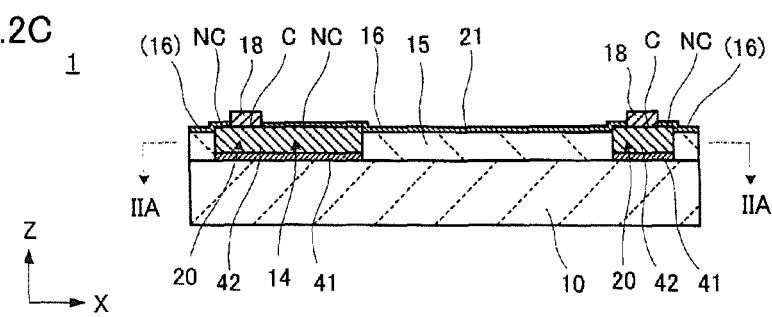
FIG. 2C is a sectional view (cut surface only) of the elastic wave device 1, along a line IIC-IIC illustrated in FIG. 1.
Figure 3:
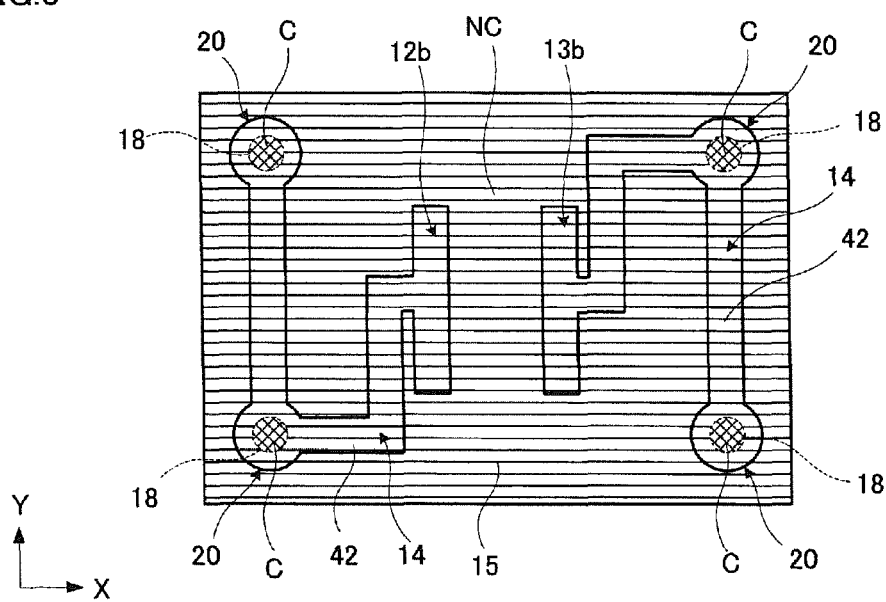
FIG. 3 is a diagram of the elastic wave device 1 in plan view in the state in which an under bump metal 18 and a second dielectric layer 16 are excluded.

FIG. 3 is a diagram of the elastic wave device 1 in the state in which the under bump metal 18 and the second dielectric layer 16 are excluded in plan view. In FIG. 3, the contact region C between the second electrically conductive layer 42 and the under bump metal 18 is indicated by cross-hatching and the region NC other than the contact region C is indicated by horizontal stripe hatching. As illustrated in FIG. 2B, FIG. 2C, and FIG. 3, the second electrically conductive layer 42 defining the busbars 12b and 13b, the wiring 14, and the pad 20 is covered with the under bump metal 18 and the second dielectric layer 16 and, therefore, is not exposed to air.

The second dielectric layer 16 is a layer to adjust the resonant frequency of the elastic wave device 1. Accordingly, it is preferable that the second dielectric layer 16 be provided and planarized on the surface 21 of the first dielectric layer 15 located on the IDT electrode 11. If the shape of the second dielectric layer 16 is uneven, the elastic wave is irregularly reflected at the second dielectric layer 16, and the reflection coefficient is reduced. Then, a large reflection coefficient is able to be obtained by planarizing the shape of the second dielectric layer 16. Consequently, the resonant frequency is able to be adjusted without degrading the frequency characteristics of the elastic wave device 1.

The second dielectric layer 16 includes, for example, a single film or a multilayer film made of $SiO_2$, SiN, $Si_3N_4$, SiON, SiC, $Ta_2O_5$, $TiO_2$, TiN, $Al_2O_3$, $TeO_2$ and the like.

Preferably, the second dielectric layer 16 includes a material having an elastic wave propagation velocity higher than the elastic wave propagation velocity of the first dielectric layer 15. The resonant frequency is adjusted by changing the thickness of the second dielectric layer 16 and if the elastic wave propagation velocity in the second dielectric layer 16 is high, the resonant frequency is able to be adjusted easily. In this regard, the thickness of the second dielectric layer 16 only needs to be a thickness which enables the elastic wave excited by the IDT electrode 11 to be used as a main mode. In the present preferred embodiment, the thickness of the second dielectric layer 16 is, for example, about 20 nm.

Preferably, the second dielectric layer 16 includes a material having a moisture permeability lower than the moisture permeability of the first dielectric layer 15. In the present preferred embodiment, the material for the second dielectric layer 16 preferably is, for example, SiN. The moisture permeability of SiN is lower than the moisture permeability of $SiO_2$ (material for the first dielectric layer) and, therefore, the moisture resistance of the elastic wave device 1 is able to be enhanced by using SiN as the material for the second dielectric layer 16.

In the elastic wave device 1 according to the present preferred embodiment, the second dielectric layer 16 is disposed above the piezoelectric substrate 10 so as to cover the region NC other than the contact region C between the second electrically conductive layer 42 and the under bump metal 18. Consequently, the second electrically conductive layer 42 defining the busbars 12b and 13b, the wiring 14, and the pad 20 is covered with the under bump metal 18 and the second dielectric layer 16 and is in the state of being not exposed to air. Therefore, in the case where the elastic wave device 1 is bonded to the mounting substrate 31 by using the solder 39, the flux contained in the solder 39 does not come into contact with the second electrically conductive layer 42. As a result, a chemical reaction between a halogenated element (for example, chlorine ion) in the flux contained in the solder paste and the material contained in the second electrically conductive film 42 does not occur and corrosion of the second electrically conductive film 42 does not occur easily.

Also, it is preferable that the second dielectric layer 16 cover the surface continuously from the surface of the second electrically conductive layer 42 to the surface 21 of the first dielectric layer 15. At the time of mounting, contact between the flux and the second electrically conductive layer 42 is prevented reliably with this structure.

Also, it is preferable that the second dielectric layer 16 be provided and planarized on the surface 21 of the first dielectric layer 15 located on the IDT electrode 11. Consequently, a large reflection coefficient is obtained with respect to the excited elastic wave and the resonant frequency is able to be adjusted without degrading the frequency characteristics of the elastic wave device 1.

Figure 4A:
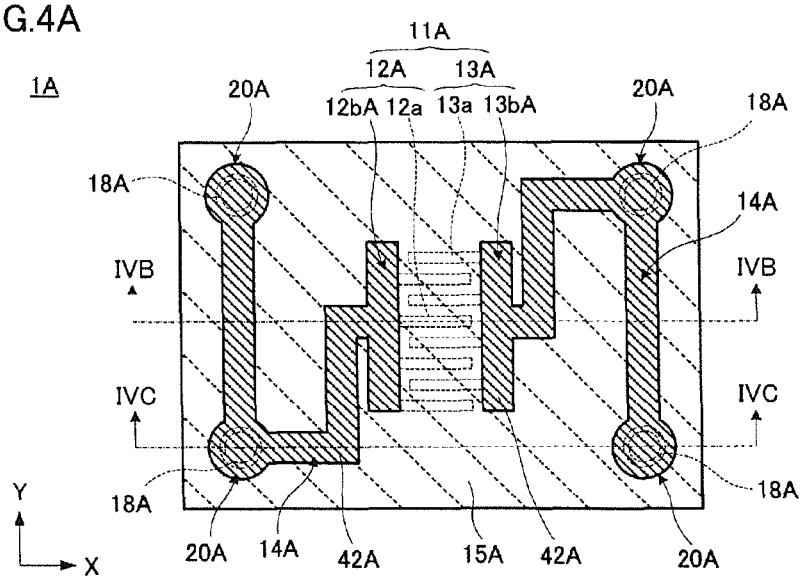
FIG. 4A is a diagram illustrating a first modified example of the elastic wave device 1 and is a sectional view (cut surface only) of an elastic wave device 1A, along a line IVA-IVA illustrated in FIG. 4B.
Figure 4B:
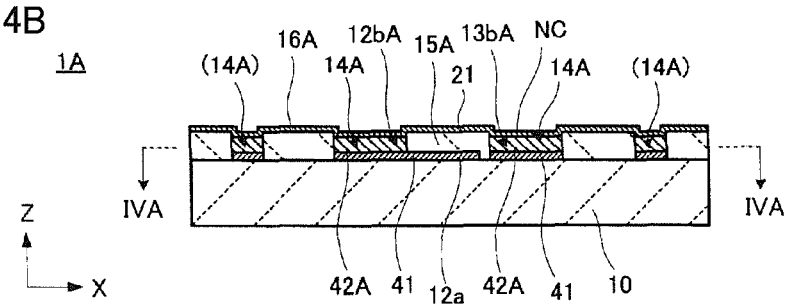
FIG. 4B is a diagram illustrating the first modified example of the elastic wave device 1 and is a sectional view (cut surface only) of the elastic wave device 1A, along a line IVB-IVB illustrated in FIG. 4A.
Figure 4C:
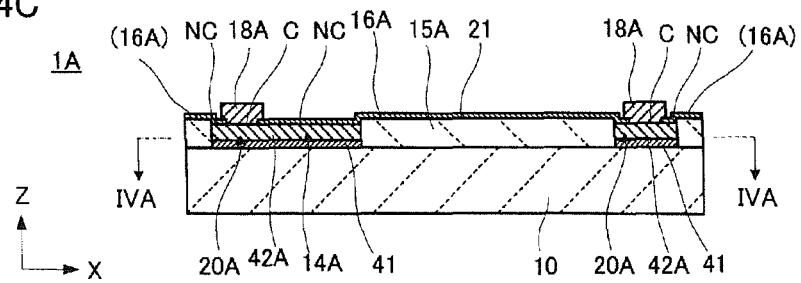
FIG. 4C is a diagram illustrating the first modified example of the elastic wave device 1 and is a sectional view (cut surface only) of the elastic wave device 1A, along a line IVC-IVC illustrated in FIG. 4A.

FIG. 4A to FIG. 4C are diagrams illustrating a first modified example of the elastic wave device 1. In the drawings, the same configurations as those in the elastic wave device 1 are indicated by the same reference numerals and the explanations will not be provided.

In an elastic wave device 1A according to the first modified example, the thickness of a second electrically conductive layer 42A defining busbars 12bA and 13bA, wiring 14A, and pads 20A is smaller than the thickness of a first dielectric layer 15A. A second dielectric layer 16A extends along the surface of the second electrically conductive layer 42A and the surface 21 of the first dielectric layer 15A. According to this structure, the elastic wave device 1A has a low profile.

Also, the under bump metal 18A of the elastic wave device 1A is not only in contact with the second electrically conductive layer 42A but also preferably covers a portion of the second dielectric layer 16A at the border between the second electrically conductive layer 42A and the second dielectric layer 16A. Consequently, a gap between the under bump metal 18A and the second dielectric layer 16A is eliminated reliably. As a result, in mounting of the elastic wave device 1A, contact between the flux and the second electrically conductive layer 42A is prevented reliably.

In the elastic wave device 1A according to the first modified example as well, the second dielectric layer 16A is disposed above the piezoelectric substrate 10 so as to cover the region NC other than the contact region C between the second electrically conductive layer 42A and the under bump metal 18A. That is, the second electrically conductive layer 42A is covered with the under bump metal 18A and the second dielectric layer 16A and is in the state of being not exposed to air. Consequently, in the case where the elastic wave device 1A is bonded to the mounting substrate 31 by using the solder 39, the flux contained in the solder 39 does not come into contact with the second electrically conductive layer 42A. As a result, a chemical reaction between a halogenated element in the flux contained in the solder paste and the material contained in the second electrically conductive film 42A does not occur and corrosion of the second electrically conductive film 42A does not occur easily.

Figure 5:
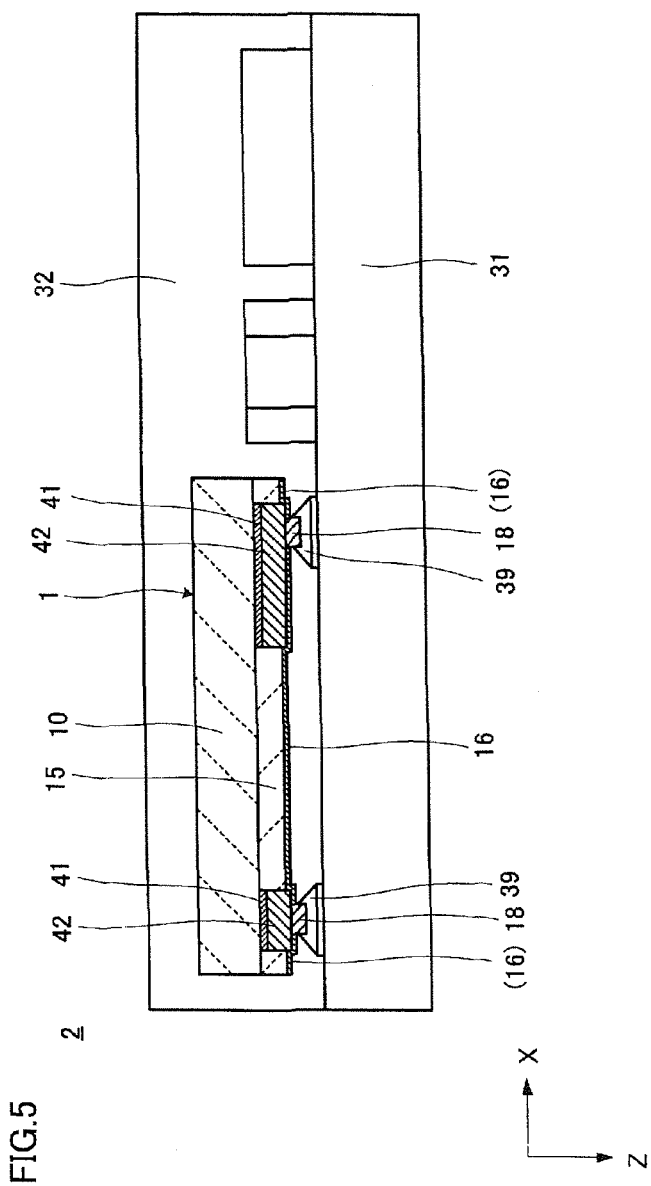
FIG. 5 is a diagram of an electronic component 2 including the elastic wave device 1, viewed in the same section as the cross-section along the line IIC-IIC illustrated in FIG. 1.

FIG. 5 is a diagram illustrating an electronic component 2 including the elastic wave device 1. Examples of electronic components 2 include a RF circuit package. The electronic component 2 includes the elastic wave device 1 and further includes the mounting substrate 31, the solder 39, and an insulating resin 32. The electronic component 2 is produced by bonding the elastic wave device 1 to the mounting substrate by using the solder 39 and, thereafter, forming the insulating resin 32 so as to cover the mounting substrate 31 and the elastic wave device 1. The material for the solder 39 is, for example, a solder paste formed from an eutectic composition of Sn, Ag, Cu, and the like. The material for the insulating resin 32 is, for example, an epoxy resin.

Figure 11:
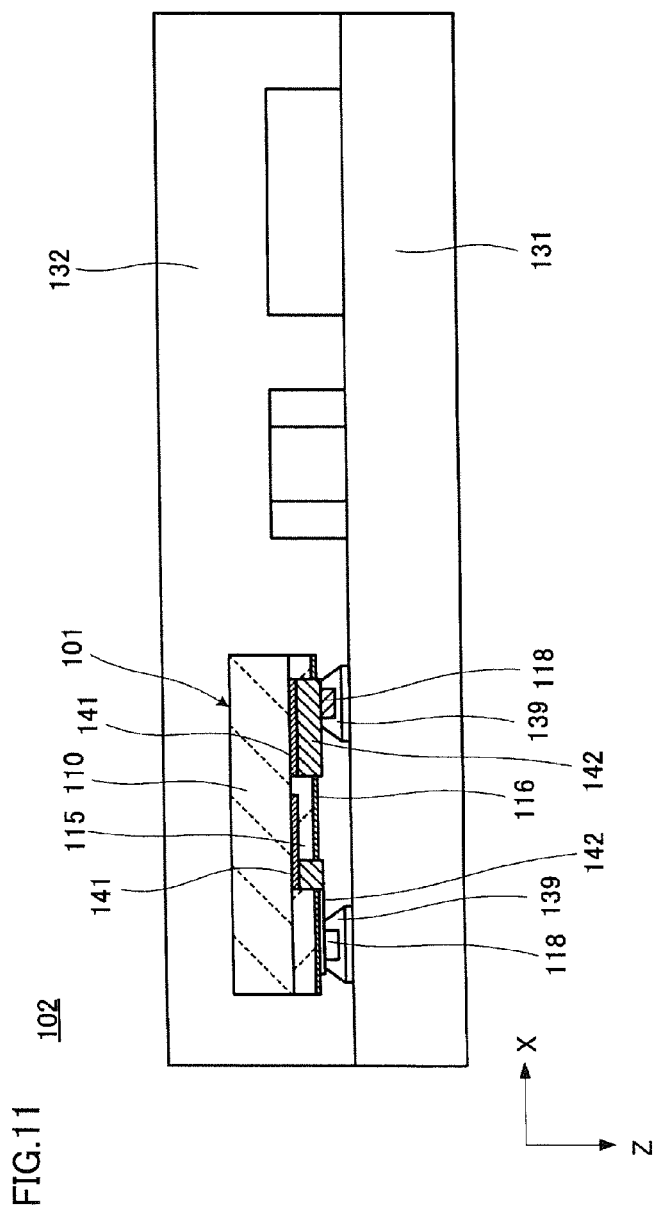
FIG. 11 is a sectional view of an electronic component 102 including the elastic wave device 101 illustrated in FIG. 9.

As illustrated in FIG. 11, in the electronic component 102 according to the related art, the solder 139 is in contact with the pad 120 of the elastic wave device 101. Consequently, at the time of mounting, the flux contained in the solder paste may adhere to the second electrically conductive layer 142 defining the pad 120 and the second electrically conductive layer 142 of the elastic wave device 101 included in the electronic component 102 may corrode.

In the electronic component 2 according to the present preferred embodiment, the solder 39 is not in contact with the pad 20 of the elastic wave device 1 and is in contact with the under bump metal 18. That is, the second electrically conductive layer 42 defining the pad 20 is covered with the under bump metal 18 and the second dielectric layer 16, and the solder 39 does not adhere to the second electrically conductive layer 42. Consequently, at the time of mounting, the flux contained in the solder paste does not adhere to the second electrically conductive layer 42, so that the second electrically conductive layer 42 of the elastic wave device 1 included in the electronic component 2 does not corrode easily.

A method for manufacturing the elastic wave device 1 will be described with reference to FIG. 6A to FIG. 6D and FIG. 7A to FIG. 7E. The method for manufacturing the elastic wave device 1 includes at least a first electrically conductive film formation step, a first dielectric layer formation step, a first opening formation step, a second electrically conductive layer formation step, a second dielectric layer formation step, a second opening formation step, and an under bump metal formation step.

Figure 6A:
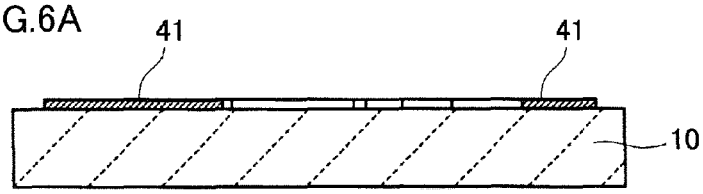
FIG. 6A is a diagram illustrating a method for manufacturing the elastic wave device 1 and illustrates a first step to form a first dielectric layer 15 on a piezoelectric substrate 10 provided with a first electrically conductive film 41.

As illustrated in FIG. 6A, the first electrically conductive film formation step is a step to form the first electrically conductive film 41 on the piezoelectric substrate 10. The first electrically conductive film 41 constitutes the electrode fingers 12a and 13a of the IDT electrode 11, a portion of the busbars 12b and 13b, a portion of the wiring 14, and a portion of the pad 20. The first electrically conductive film 41 is formed by, for example, a thin film formation process, e.g., lift-off.

Figure 6B:
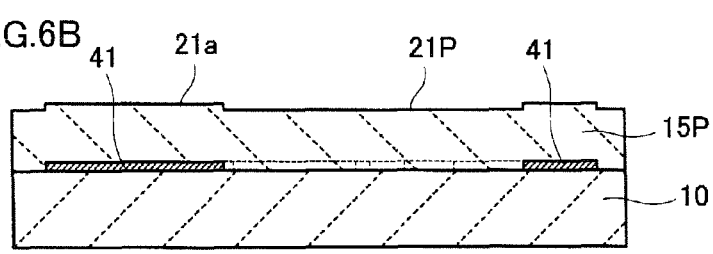
FIG. 6B is a diagram illustrating the method for manufacturing the elastic wave device 1 and illustrates a second step to form the first dielectric layer 15 on the piezoelectric substrate 10 provided with the first electrically conductive film 41.
Figure 6C:
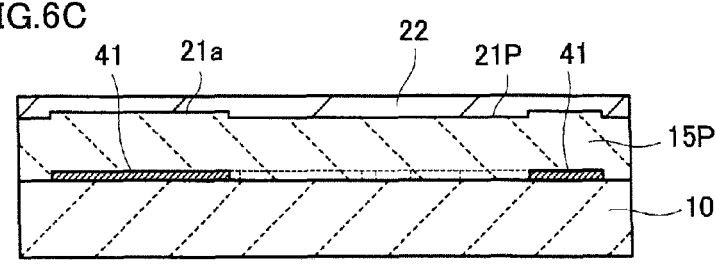
FIG. 6C is a diagram illustrating the method for manufacturing the elastic wave device 1 and illustrates a third step to form the first dielectric layer 15 on the piezoelectric substrate 10 provided with the first electrically conductive film 41.
Figure 6D:
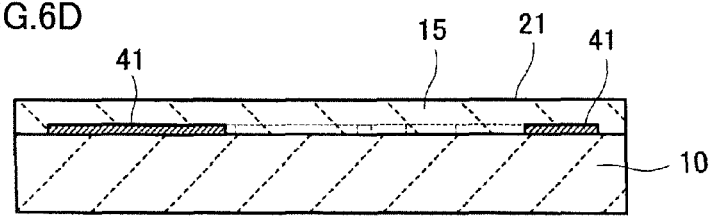
FIG. 6D is a diagram illustrating the method for manufacturing the elastic wave device 1 and illustrates a fourth step to form the first dielectric layer 15 on the piezoelectric substrate 10 provided with the first electrically conductive film 41.

As illustrated in FIGS. 6B to 6D, the first dielectric layer formation step is a step to form the first dielectric layer 15 having a predetermined thickness on the piezoelectric substrate 10 so as to cover the first electrically conductive film 41.

In the formation of the first dielectric layer 15 having a predetermined thickness, first as illustrated in FIG. 6B, a first dielectric layer 15P having a thickness larger than the thickness of the first dielectric layer 15 is formed. The first dielectric layer 15P is formed by a bias sputtering method or the like. Immediately after formation of the first dielectric layer 15P, a convex portion 21a is formed in the surface 21P of the first dielectric layer 15P because the shape of the first electrically conductive film 41 on the piezoelectric substrate is transferred. The height of the convex portion 21a preferably is, for example, about 3% on a ratio relative to the wavelength of the propagating elastic wave basis. If there is unevenness on the surface 21 of the first dielectric layer 15, the insertion loss of the elastic wave device 1 increases, so that, subsequently, the surface 21P of the first dielectric layer 15P is planarized by a method illustrated in FIG. 6C and FIG. 6D.

First, as illustrated in FIG. 6C, a sacrificial layer 22 is formed so as to cover the first dielectric layer 15P. As for the sacrificial layer 22, for example, a photoresist, e.g., BARC (bottom anti-reflective coating) or TARC (top anti-reflective coating), SOG (spin on glass), or the like is used. The sacrificial layer 22 is formed by, for example, a spin coating method. The thickness of the sacrificial layer 22 is larger than the height of the convex portion 21a of the surface 21P of the first dielectric layer 15P. Consequently, the entire surface 21P of the first dielectric layer 15P is covered with the sacrificial layer 22.

Subsequently, as illustrated in FIG. 6D, the sacrificial layer 22 and the surface 21P of the first dielectric layer 15P are subjected to etch back (removal). This etch back is performed by, for example, a dry etching method or a wet etching method. Consequently, the surface 21P and the convex portion 21a of the first dielectric layer 15P are removed and the surface 21 of the first dielectric layer 15 is planarized. Differences in the height of the surface 21 of the first dielectric layer 15 preferably are, for example, about 0% to about 1% on a ratio relative to the wavelength of the propagating elastic wave basis.

In the etch back, the etching selection ratio of the first dielectric layer 15P to the sacrificial layer 22 is preferably within the range of 0.6:1 to 1.4:1, for example. More preferably, the selection ratio is desirably close to 1:1, for example. The surface 21 of the first dielectric layer 15 is further planarized by performing etch back at such a selection ratio.

Figure 7A:
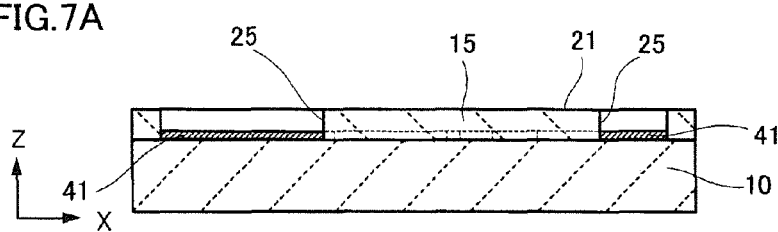
FIG. 7A is a diagram illustrating the method for manufacturing the elastic wave device 1 and illustrates a first step to form a second electrically conductive film 42, a second dielectric layer 16, and an under bump metal 18 after the step illustrated in FIG. 6D.

As illustrated in FIG. 7A, the first opening formation step is a step to form first opening 25 by removing a portion of the first dielectric layer 15. The first opening 25 is formed so as to expose the first electrically conductive film 41 located at the busbars 12b and 13b of the IDT electrode 11 and to be continuous from the location of the exposed first electrically conductive film 41 to the location at which the wiring 14 and the pad 20 are to be formed. Removal of the first dielectric layer 15 is performed by, for example, the dry etching method or the wet etching method.

Figure 7B:
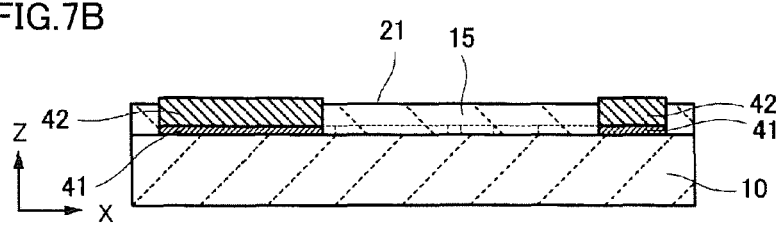
FIG. 7B is a diagram illustrating the method for manufacturing the elastic wave device 1 and illustrates a second step to form the second electrically conductive film 42, the second dielectric layer 16, and the under bump metal 18 after the step illustrated in FIG. 6D.

As illustrated in FIG. 7B, the second electrically conductive film formation step is a step to form the second electrically conductive film 42 in the first opening 25. The second electrically conductive film 42 is stacked on the first electrically conductive film 41 present in the first opening 25. A layered body formed from the first electrically conductive film 41 and the second electrically conductive film 42 defines the busbars 12b and 13b, the wiring 14, and the pad 20. The second electrically conductive film 42 is formed by, for example, the thin film formation process, e.g., lift-off.

Figure 7C:
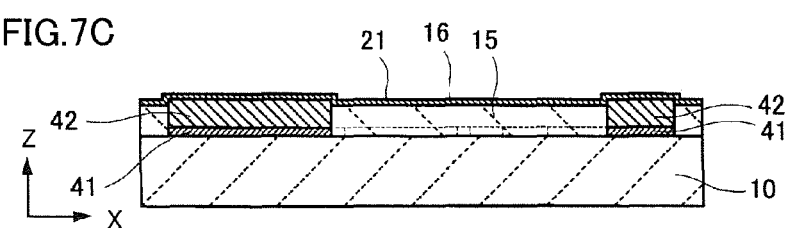
FIG. 7C is a diagram illustrating the method for manufacturing the elastic wave device 1 and illustrates a third step to form the second electrically conductive film 42, the second dielectric layer 16, and the under bump metal 18 after the step illustrated in FIG. 6D.

As illustrated in FIG. 7C, the second dielectric layer formation step is a step to form the second dielectric layer 16 so as to cover the first dielectric layer 15 and the second electrically conductive film 42. As illustrated in FIG. 6D, the surface 21 of the first dielectric layer 15 is formed and planarized and, therefore, the second dielectric layer 16 is also formed and planarized above the IDT electrode 11 (in the Z direction). The second dielectric layer 16 is formed so as to have a uniform or substantially uniform thickness by, for example, the thin film formation process, e.g., an evaporation method and a sputtering method.

Figure 7D:
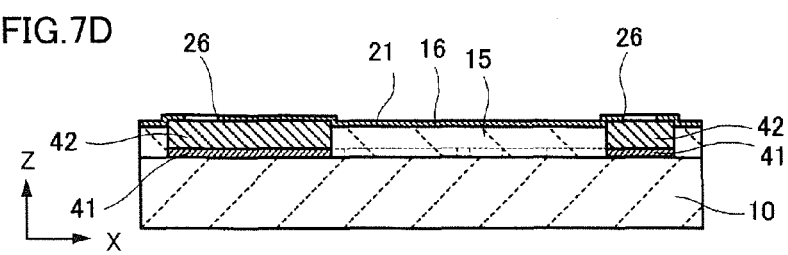
FIG. 7D is a diagram illustrating the method for manufacturing the elastic wave device 1 and illustrates a fourth step to form the second electrically conductive film 42, the second dielectric layer 16, and the under bump metal 18 after the step illustrated in FIG. 6D.

As illustrated in FIG. 7D, the second opening formation step is a step to form the second opening 26 by removing a portion of the second dielectric layer 16. The second opening 26 is formed so as to expose a portion of the second electrically conductive film 42 on the pad 20 by removing the second dielectric layer 16 above the pad 20 (in the Z direction). The removal of the second dielectric layer 16 is performed by, for example, the dry etching method or the wet etching method.

Figure 7E:
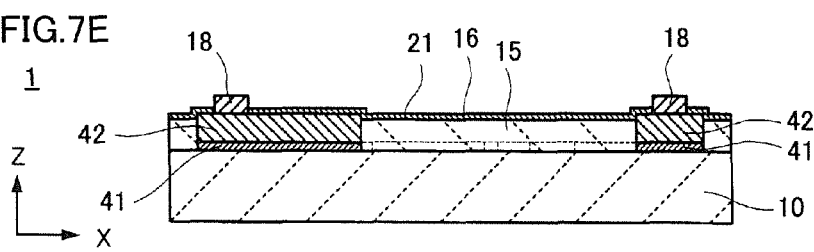
FIG. 7E is a diagram illustrating the method for manufacturing the elastic wave device 1 and illustrates a fifth step to form a second electrically conductive film 42, the second dielectric layer 16, and the under bump metal 18 after the step illustrated in FIG. 6D.
Figure 8A:
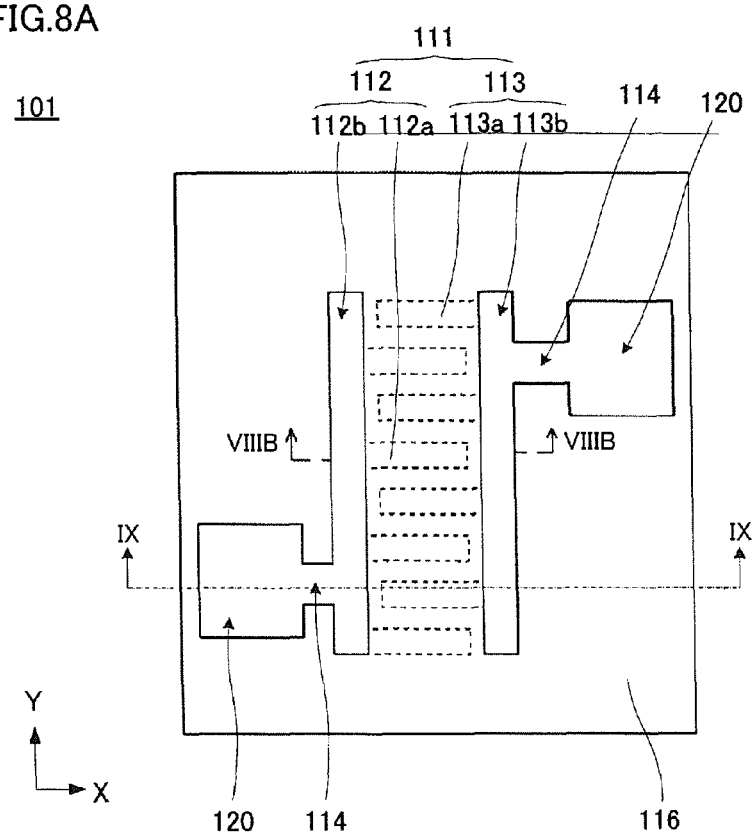
FIG. 8A is a sectional view of the elastic wave device 101 according to Japanese Unexamined Patent Application Publication No. 2011-244065, viewed from above.
Figure 8B:
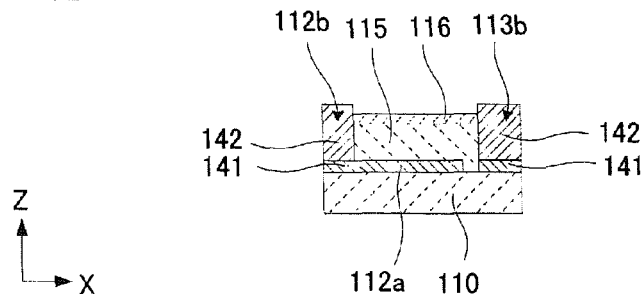
FIG. 8B is a sectional view of the elastic wave device 101, along a line VIIIB-VIIIB illustrated in FIG. 8A.
Figure 9:
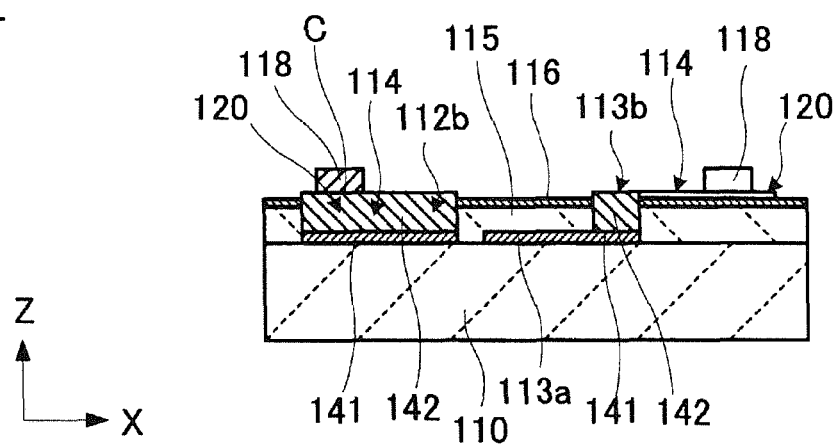
FIG. 9 is a sectional view of the elastic wave device 101, along a line IX-IX illustrated in FIG. 8A.
Figure 10A:
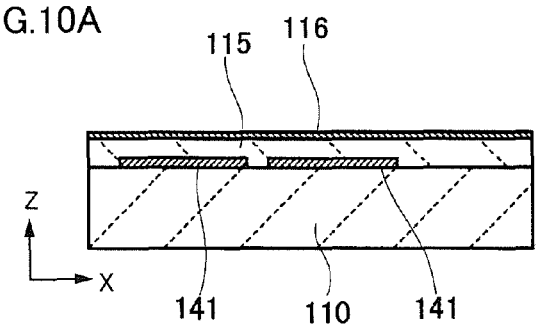
FIG. 10A is a diagram illustrating a first step of a method for manufacturing the elastic wave device 101 illustrated in FIG. 9.
Figure 10B:
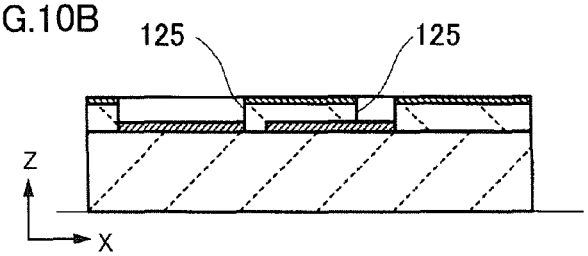
FIG. 10B is a diagram illustrating a second step of the method for manufacturing the elastic wave device 101 illustrated in FIG. 9.
Figure 10C:
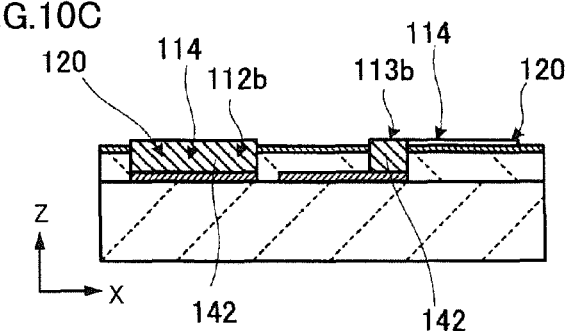
FIG. 10C is a diagram illustrating a third step of the method for manufacturing the elastic wave device 101 illustrated in FIG. 9.
Figure 10D:
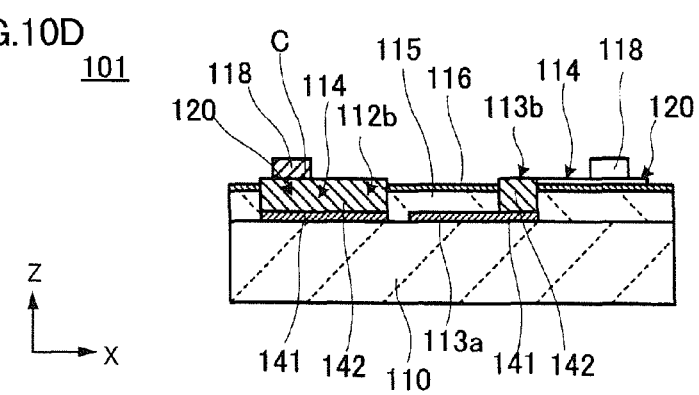
FIG. 10D is a diagram illustrating a fourth step of the method for manufacturing the elastic wave device 101 illustrated in FIG. 9.

As illustrated in FIG. 7E, the under bump metal formation step is a step to form the under bump metal 18 in the second opening 26. The under bump metal 18 is formed by making a film of a metal in the second opening 26. The second opening 26 is closed by the under bump metal 18 and the second electrically conductive film 42 on the pad 20 is not exposed. The under bump metal 18 is formed on the pad 20 and, as a result, the pad 20 is electrically connected to the under bump metal 18. The under bump metal 18 is formed by, for example, a plating growth method so that the thickness of the under bump metal 18 becomes larger than the thickness of the second dielectric layer 16. The elastic wave device 1 is produced through these steps illustrated in FIG. 6A to FIG. 6D and FIG. 7A to FIG. 7E.

In the method for manufacturing the elastic wave device 101 according to the related art, as described above (refer to FIG. 10A to FIG. 10D), after the first dielectric layer 115 and the second dielectric layer 116 are formed on the piezoelectric substrate 10, the opening 125 is formed and the second electrically conductive film 142 is formed therein. Consequently, the second electrically conductive film 142 is not covered with the second dielectric layer 116 and is exposed to air.

In the method for manufacturing the elastic wave device 1 according to the present preferred embodiment, after the first dielectric layer 15 and the second electrically conductive film 42 are formed on the piezoelectric substrate 10, the second dielectric layer 16 is formed thereon, the second opening 26 is formed only in the region to be provided with the under bump metal 18, and the under bump metal 18 is formed therein. Consequently, after the elastic wave device 1 is produced, the second electrically conductive film 42 is not exposed to air. As a result, in the case where the elastic wave device 1 is bonded to the mounting substrate 31 by using the solder 39, the flux contained in the solder paste does not come into contact with the second electrically conductive film 42, and the second electrically conductive film 42 does not corrode easily.

Also, in the method for manufacturing the elastic wave device 1, the first dielectric layer 15P having a large thickness is formed once and, thereafter, the surface 21 of the first dielectric layer 15 is planarized by subjecting the surface 21P of the first dielectric layer 15P to etch back. Consequently, unevenness is not formed on the surface 21 of the first dielectric layer 15, degradation of the insertion loss of the elastic wave is significantly reduced or prevented, and spurious due to a higher-order mode of the elastic wave is significantly reduced. Also, the second dielectric layer 16 formed on the surface 21 of the first dielectric layer 15 is planarized, so that occurrences of shifts of the frequency characteristics, e.g., the resonant frequency and the anti-resonant frequency, and a shift of TCF is significantly reduced or prevented. Consequently, the elastic wave device 1 having desirable resonance characteristics is produced.

Preferred embodiments of the present invention do not limit the present invention described in the claims and can be variously modified within the bounds of not impairing the identity with the technical idea. For example, the busbar may be part of the configuration of the wiring. Also, a dielectric layer for temperature characteristic compensation may be separately disposed between the piezoelectric substrate and the IDT electrode.

Also, in the present preferred embodiment, although the elastic wave device has been shown as an example of 1-port elastic wave resonators, other preferred embodiments may be applied to elastic wave filters, elastic wave branching filters, and the like. Although the elastic wave device preferably uses a Rayleigh (P+SV (shear vertical) wave) as a main mode, any type of elastic wave may be used as the main mode, and an elastic wave e.g., love wave or leaky wave, other than the Rayleigh wave may be used as the main mode.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a piezoelectric substrate;
   an IDT electrode disposed on the piezoelectric substrate;
   a pad disposed on the piezoelectric substrate;
   wiring which is disposed on the piezoelectric substrate and which connects the IDT electrode to the pad;
   a first dielectric layer disposed on the piezoelectric substrate so as to cover at least a portion of the IDT electrode and not cover the wiring and the pad;
   an under bump metal disposed on the pad; and
   a second dielectric layer disposed above the piezoelectric substrate so as to cover a portion of the pad, the wiring, and the first dielectric layer and not cover the under bump metal; wherein
   at least a portion of the IDT electrode includes a first electrically conductive film;
   at least a portion of the wiring includes a multilayer body including the first electrically conductive film and a second electrically conductive film stacked on the first electrically conductive film;
   at least a portion of the pad includes the second electrically conductive film;
   the second electrically conductive film is covered by the under bump metal and the second dielectric layer; and
   the under bump metal is in contact with the second electrically conductive film, and covers a portion of the second dielectric layer.

2. The elastic wave device according to claim 1, wherein the second dielectric layer continuously cover a surface of the second electrically conductive film and a surface of the first dielectric layer.

3. The elastic wave device according to claim 1, wherein the second dielectric layer is planarized on the surface of the first dielectric layer located on the IDT electrode.

4. The elastic wave device according to claim 1, wherein a material for the second dielectric layer has an elastic wave propagation velocity higher than an elastic wave propagation velocity of a material for the first dielectric layer.

5. The elastic wave device according to claim 1, wherein a material for the second dielectric layer has a moisture permeability lower than a moisture permeability of a material for the first dielectric layer.

6. An electronic component comprising:
   the elastic wave device according to claim 1;
   a mounting substrate on which the elastic wave device is mounted; and
   solder disposed between the elastic wave device and the mounting substrate; wherein
   the solder is not in contact with the second electrically conductive film of the elastic wave device and is in contact with the under bump metal.

7. The electronic component according to claim 6, wherein the second dielectric layer continuously cover a surface of the second electrically conductive film and a surface of the first dielectric layer.

8. The electronic component according to claim 6, wherein the second dielectric layer is planarized on the surface of the first dielectric layer located on the IDT electrode.

9. The electronic component according to claim 6, wherein a material for the second dielectric layer has an elastic wave propagation velocity higher than an elastic wave propagation velocity of a material for the first dielectric layer.

10. The electronic component according to claim 6, wherein a material for the second dielectric layer has a moisture permeability lower than a moisture permeability of a material for the first dielectric layer.

11. A method for manufacturing the elastic wave device according to claim 1, comprising:
- forming a first electrically conductive film on a piezoelectric substrate;
- forming a first dielectric layer on the piezoelectric substrate so as to cover the first electrically conductive film;
- forming a first opening in the first dielectric layer so as to expose a portion of the first electrically conductive film;
- forming a second electrically conductive film in the first opening;
- forming a second dielectric layer so as to cover the first dielectric layer and the second electrically conductive film;
- forming a second opening in the second dielectric layer so as to expose a portion of the second electrically conductive film; and
- forming an under bump metal in the second opening.

12. The method according to claim 11, wherein the second dielectric layer continuously cover a surface of the second electrically conductive film and a surface of the first dielectric layer.

13. The method according to claim 11, wherein the second dielectric layer is planarized on the surface of the first dielectric layer located on the IDT electrode.

14. The method according to claim 11, wherein a material for the second dielectric layer has an elastic wave propagation velocity higher than an elastic wave propagation velocity of a material for the first dielectric layer.

15. The method according to claim 11, wherein a material for the second dielectric layer has a moisture permeability lower than a moisture permeability of a material for the first dielectric layer.

* * * * *